United States Patent
Kojima et al.

(10) Patent No.: US 8,624,242 B2
(45) Date of Patent: Jan. 7, 2014

(54) SEMICONDUCTOR INTEGRATED CIRCUIT

(71) Applicants: Hiroshi Kojima, Ora-gun (JP); Fumio Marutani, Ora-gun (JP)

(72) Inventors: Hiroshi Kojima, Ora-gun (JP); Fumio Marutani, Ora-gun (JP)

(73) Assignee: Semiconductor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 13/711,169

(22) Filed: Dec. 11, 2012

(65) Prior Publication Data
US 2013/0146874 A1   Jun. 13, 2013

(30) Foreign Application Priority Data
Dec. 13, 2011   (JP) ................................. 2011-271806

(51) Int. Cl.
*H01L 23/52*   (2006.01)

(52) U.S. Cl.
USPC ....... 257/48; 257/690; 257/691; 257/E23.141

(58) Field of Classification Search
USPC .............................. 257/690–697, 48, E23.141
See application file for complete search history.

(56) References Cited

U.S. PATENT DOCUMENTS

| 6,097,622 A * | 8/2000 | Shimizu et al. ................ 365/145 |
| 6,287,885 B1 * | 9/2001 | Muto et al. ....................... 438/48 |
| 2012/0079882 A1 * | 4/2012 | Chiba et al. ................ 73/514.29 |
| 2013/0062605 A1 * | 3/2013 | Takahashi ........................ 257/48 |

FOREIGN PATENT DOCUMENTS

| JP | 2000-188305 | 7/2000 |
| JP | 2005-72554 | 3/2005 |

* cited by examiner

*Primary Examiner* — Thanh Nguyen
(74) *Attorney, Agent, or Firm* — Morrison & Foerster LLP (57) ABSTRACT

There is offered a semiconductor integrated circuit provided with a function to electrically identify a location where a defect such as chipping of an LSI die or separation of resin is caused. Corresponding to each of the four corners of a semiconductor substrate, each of L-shaped first through fourth peripheral wirings having a first end and a second end is disposed on a periphery of the semiconductor substrate. The first end of each of the first through fourth peripheral wirings is connected with a power supply wiring. Each of first through fourth detection circuits detects breaking of corresponding each of the first through fourth peripheral wirings in response to a voltage at the second end of corresponding each of the first through fourth peripheral wirings, and outputs corresponding each of first through fourth detection signals to corresponding each of output pads.

9 Claims, 6 Drawing Sheets

FIG.3
LASER BEAM DETECTION STATE

Amp_outx = Vref + Ipx × R5

FIG.4

NORMAL STATE
(WITHOUT BREAKING OF PERIPHERAL WIRING)

FIG.5

ABNORMAL STATE
(WITH BREAKING OF PERIPHERAL WIRING)

SEMICONDUCTOR INTEGRATED CIRCUIT

CROSS-REFERENCE OF THE INVENTION

This application claims priority from Japanese Patent Application No. 2011-271806, the content of which is incorporated herein by reference in its entirety.

BACKGROUND OF THE INVENTION

1. Field of the Invention

This invention relates to a semiconductor integrated circuit, specifically to a semiconductor integrated circuit using a WLP (Wafer Level Package) or a CSP (Chip Size Package).

2. Description of the Related Art

In recent years, the wafer level package (hereafter referred to as WLP) and the chip size package (hereafter referred to as CSP) have come into widespread use. The WLP and the CSP are packages intended for high density mounting, and have a size comparable to an LSI die packaged in it.

The WLP and the CSP are manufactured at a semiconductor fab, and is shipped to a customer after a pre-shipment test. The customer manufactures his products by mounting various kinds of electronic parts including the WLP or the CSP onto a circuit board using electronic parts mounting apparatus such as a chipmounter at his production plant. Related technologies are disclosed in Japanese Patent Application Publication Nos. 2000-188305 and 2005-72554, for example.

The WLP and the CSP are more susceptible to mechanical damage in handling or in mounting onto the circuit board compared with a resin mold package. Potential defects resulting from the damage are chipping or cracking of the LSI die, separation of a resin layer covering a surface of the LSI die and the like, which are prone to be caused in a periphery of the die.

In the production process at the customer, it is required for the purpose of helping failure analysis and improvement of the process that a location of the semiconductor die in which the defect is caused due to the stress applied to the WLP or the CSP when the WLP of the CSP is mounted onto the circuit board is electrically identified.

This invention is directed to offering a semiconductor integrated circuit provided with a function to detect the defect such as the chipping of the LSI die or the separation of the resin layer, specifically a function to electrically identify the location of the defect.

SUMMARY OF THE INVENTION

A semiconductor integrated circuit includes a semiconductor substrate having four edges and four corners. Each of the four corners corresponds to an intersection of a neighboring pair of the edges. The circuit also includes four L-shaped peripheral wirings. Each of the four L-shaped peripheral wirings has a first end and a second end and disposed on a periphery of the semiconductor substrate around a corresponding one of the four corners. The circuit also includes a power supply wiring that is of a closed-loop shape and disposed on a periphery of the semiconductor substrate. The power supply wiring is connected with the first end of each of the four peripheral wirings and is provided with a power supply voltage. The circuit also includes four detection circuits disposed on the semiconductor substrate so as to be surrounded by the power supply wiring. Each of the four detection circuits detects breaking of a corresponding one of the four peripheral wirings in response to a voltage at the second end of the corresponding one of the four peripheral wirings and outputting a detection signal, and four output pads disposed on the semiconductor substrate or adjacent the semiconductor substrate. The detection signal of each of the four detection circuits is outputted through a corresponding one of the four output pads.

DETAILED DESCRIPTION OF THE INVENTION

First Embodiment

Overall Structure of a Semiconductor Integrated Circuit 100

Figure 1:
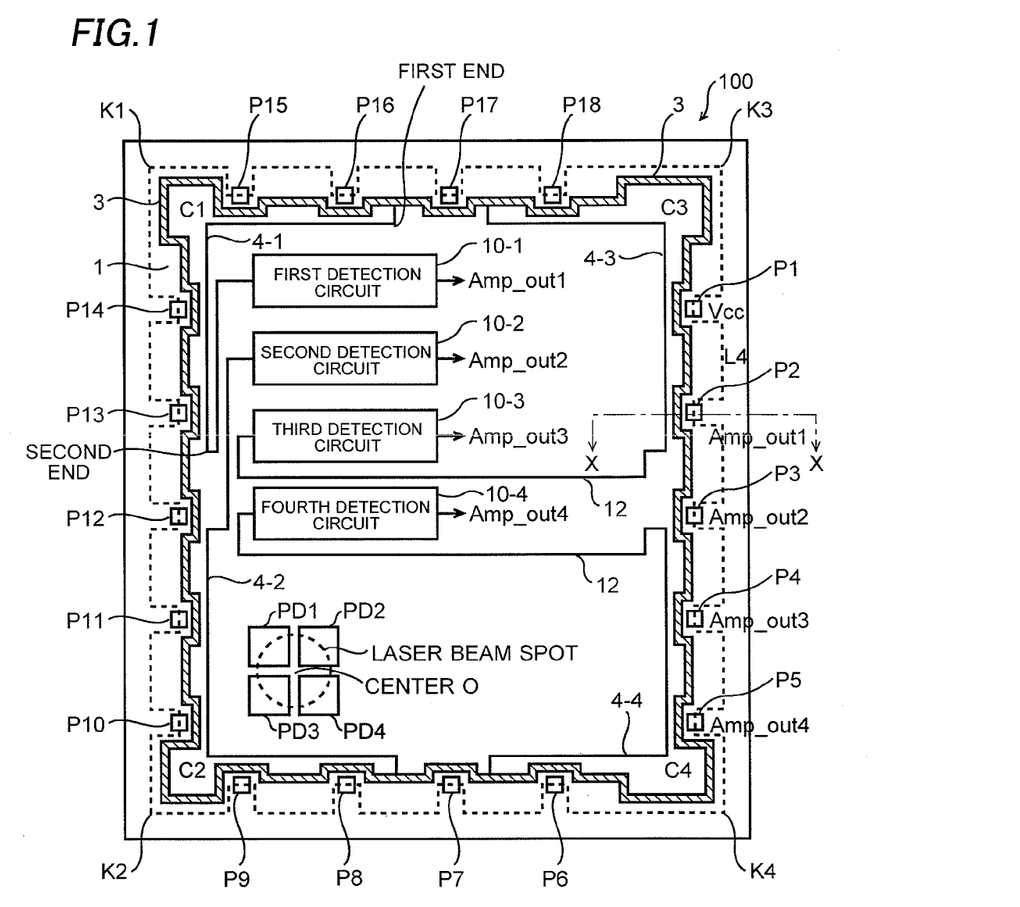
FIG. 1 is a plan view showing a semiconductor integrated circuit according to a first embodiment of this invention.
Figure 2:
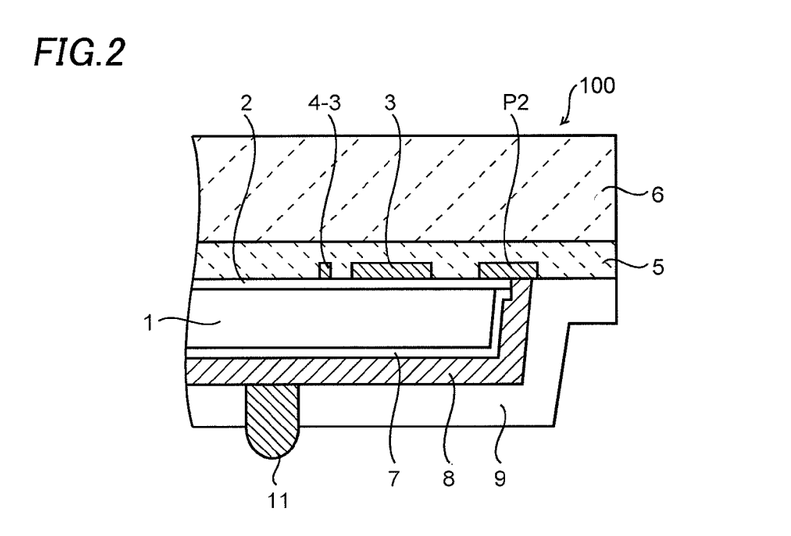
FIG. 2 is a cross-sectional view showing a section X-X in FIG. 1.

FIG. 1 is a plan view of a semiconductor integrated circuit 100 according to a first embodiment of this invention. FIG. 2 is a cross-sectional view of a section X-X shown in FIG. 1. The semiconductor integrated circuit 100 is provided with a function to detect electrically a laser beam from a semiconductor laser in an optical disk unit, and is packaged using the CSP technology, for example.

A semiconductor substrate 1 has four edges L1-L4 and four corners K1-K4 each corresponding to an intersection of a neighboring pair of the edges, as shown in FIG. 1. The four edges L1-L4 are depicted with broken lines in FIG. 1. The edges L1-L4 have convex portions and concave portions in which pads P1-P18 of the semiconductor integrated circuit 100 are disposed. A ring-shaped power supply wiring 3 is disposed along an entire periphery of a top surface of the semiconductor substrate 1.

The power supply wiring 3 is provided with a power supply voltage Vcc from a power supply pad P1 through a wiring (not shown). A region of the semiconductor substrate 1 surrounded by the power supply wiring 3 makes a circuit forming region. The power supply wiring 3 serves to block infiltration of moisture and contaminating material from outside as well as supplying the power supply voltage Vcc to the circuit. For that purpose, it is preferable that the power supply wiring 3 is made of a multilayer wiring having a width of 20 μm, for example, that is larger than widths of other wirings in the circuit forming region.

Each of L-shaped first through fourth peripheral wirings 4-1-4-4 having a first end and a second end is disposed correspondingly to each of the four corners K1-K4 on the periphery of the semiconductor substrate 1.

That is, each of the first through fourth peripheral wirings 4-1-4-4 extends from each of locations C1-C4 in the circuit forming region corresponding to each of the four corners K1-K4 halfway along a neighboring pair of the edges. The first end of each of the first through fourth peripheral wirings 4-1-4-4 is connected with the power supply wiring 3. The second ends of the first through fourth peripheral wirings 4-1-4-4 are separated from each other so as not to make a short-circuit.

The first through fourth peripheral wirings 4-1-4-4 are disposed on the periphery of the semiconductor substrate 1 because defects such as chipping of the semiconductor substrate 1 (LSI die) and separation of a resin layer for protection are prone to be caused in the periphery. The reason why the four peripheral wirings that are the first through fourth peripheral wirings 4-1-4-4 are provided instead of a single peripheral wiring is to identify a location where the defect is caused.

It is preferable that a width of each of the first through fourth peripheral wirings 4-1-4-4 is determined in accordance with a minimum design rule of the semiconductor integrated circuit 100, which is 0.6 µm, for example, that is substantially smaller than the width of the power supply wiring 3.

The width of each of the first through fourth peripheral wirings 4-1-4-4 is formed relatively small so that the defects such as the chipping of the semiconductor substrate 1 (LSI die) and the separation of the resin layer for protection are detected by its breaking. That is, when this kind of defect is caused, the first through fourth peripheral wirings 4-1-4-4 are more prone to be broken because of their smaller width by a mechanical damage or a stress which caused the defect.

It is noted that the first through fourth peripheral wirings 4-1-4-4 may be formed on the semiconductor substrate 1 outside the power supply wiring 3.

Each of first through fourth detection circuits 10-1-10-4 is disposed in the circuit forming region surrounded by the power supply wiring 3, detects the breaking of corresponding each of the first through fourth peripheral wirings 4-1-4-4 in response to a voltage at the second end of corresponding each of the first through fourth peripheral wirings 4-1-4-4, and outputs corresponding each of first through fourth detection signals Amp_out1-Amp_out4 to corresponding each of output pads P1-P4.

As a result, whether each of the first through fourth peripheral wirings 4-1-4-4 is broken or not can be detected based on corresponding each of the first through fourth detection signals Amp_out1-Amp_out4. Examples of concrete structures of the first through fourth detection circuits 10-1-10-4 are to be described.

FIG. 2 is a cross-sectional view of a region around the output pad P2. The output pad P2, the power supply wiring 3 and the third peripheral wiring 4-3 are disposed on the top surface of the semiconductor substrate 1 through a first insulation film 2. According to the CSP technology, the output pad P2 is disposed in the concave portion of the semiconductor substrate 1 (an opening formed by partially cutting the semiconductor substrate 1), and a part of or whole of its back surface is exposed out of the semiconductor substrate 1. That is, the output pad P2 is disposed on the semiconductor substrate 1 or adjacent the semiconductor substrate 1.

A supporting material 6 made of a transparent substrate such as a glass substrate is attached to the top surface of the semiconductor substrate 1 through an adhesion layer 5 made of resin. A second insulation film 7 is formed on a back surface and a side surface of the semiconductor substrate 1. A wiring layer 8 that extends over the back surface and the side surface to reach the top surface of the semiconductor substrate 1 is formed on the second insulation film 7. An end of the wiring layer 8 is electrically connected to the back surface of the output pad P2. The back surface and the side surface of the semiconductor substrate 1, on which the wiring layer 8 is formed, are covered with a resin layer 9 for protection.

An opening is formed in a portion of the resin layer 9 on the back surface of the semiconductor substrate 1, and there is formed a bump electrode 11 (protruding electrode) that is electrically connected with the wiring layer 8 through the opening. Regions around the other pads such as the power supply pad P1 and the output pads P3-P5 are formed similarly.

The semiconductor integrated circuit 100 formed by the CSP technology as described above is shipped to the customer. The customer manufactures various kinds of products by mounting various kinds of electronic parts including the semiconductor integrated circuit 100 onto a circuit board using electronic parts mounting apparatus such as a chip-mounter.

At that time, the semiconductor integrated circuit 100 is aligned to the circuit board so that the bump electrode 11 on the back surface of the semiconductor integrated circuit 100 is electrically connected to a printed wiring or the like on the circuit board. In some cases, the defect such as chipping of the semiconductor substrate 1 of the semiconductor integrated circuit 100 is caused by the mechanical damage or the stress on that occasion. With the semiconductor integrated circuit 100 according to the embodiment, it is made possible to electrically identify which of the first through fourth peripheral wirings 4-1-4-4 corresponds to the location where the damage is caused.

Examples of the First Through Fourth Detection Circuits 10-1-10-4

Figure 3:
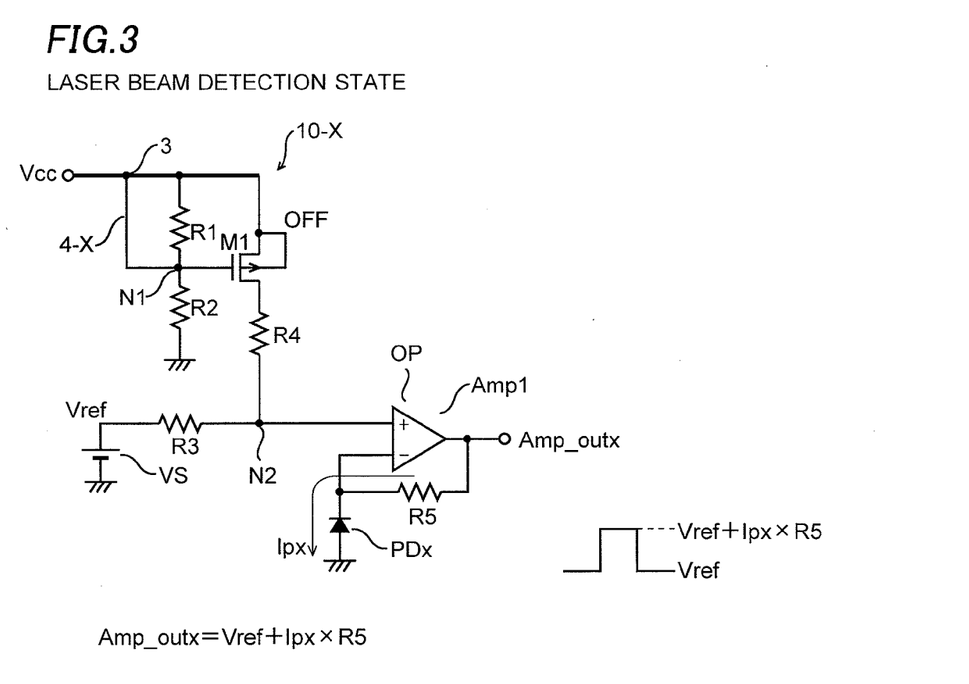
FIG. 3 shows a first circuit of each of first through fourth detection circuits in a laser beam detection state.
Figure 4:
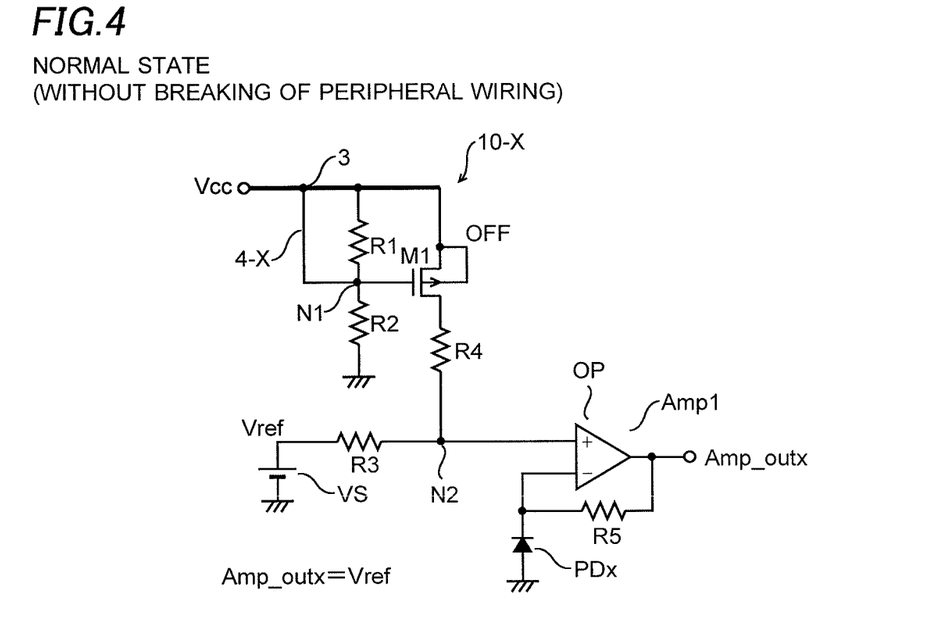
FIG. 4 shows the first circuit of each of the first through fourth detection circuits in a normal state.
Figure 5:
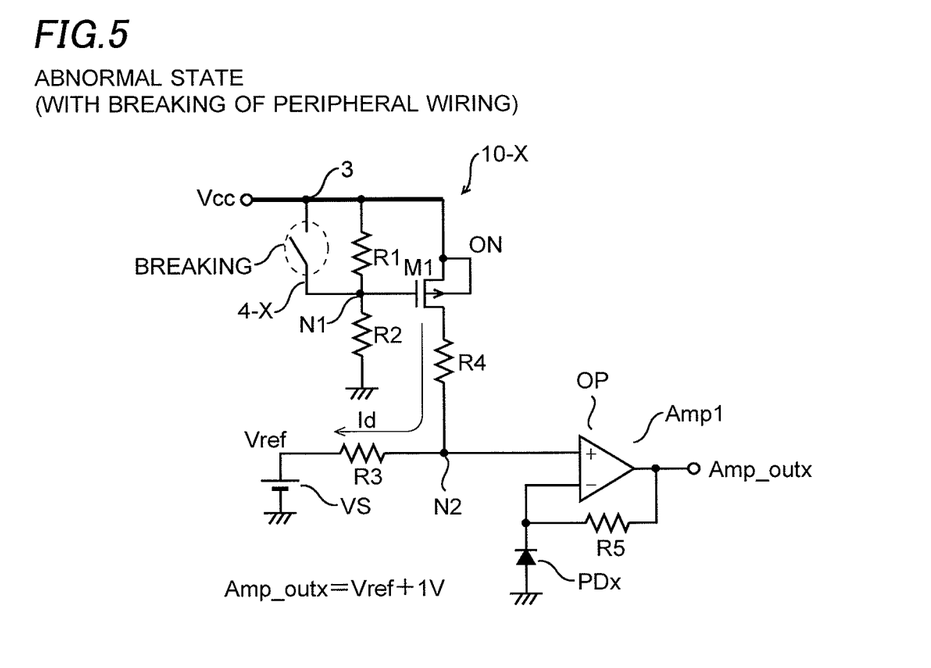
FIG. 5 shows the first circuit of each of the first through fourth detection circuits in an abnormal state.

Each of the first through fourth detection circuits 10-1-10-4 that are identical to each other has a structure as shown in FIGS. 3-5. While FIGS. 3-5 show the same circuit diagram, FIG. 3 is to explain operation in a laser beam detection state, FIG. 4 is to explain operation in a normal state (without breaking of the peripheral wiring) and FIG. 5 is to explain operation in an abnormal state (with breaking of the peripheral wiring).

In the following explanation, one of the first through fourth peripheral wirings 4-1-4-4 is represented as a peripheral wiring 4-X, and a corresponding one of the first through fourth detection circuits 10-1-10-4 is represented as a detection circuit 10-X. The detection circuit 10-X includes a first resistor R1, a second resistor R2, a third resistor R3, an amplifier circuit Amp1, a reference voltage source VS and a P-channel type MOS transistor M1 (switching device).

The first resistor R1 and the second resistor R2 are connected in series between the power supply wiring 3 and a ground. A first end of the peripheral wiring 4-X is electrically connected with the power supply wiring 3, while a second end of the peripheral wiring 4-X is electrically connected with a connecting node N1 between the first resistor R1 and the second resistor R2.

In this case, the second end of the peripheral wiring 4-X is connected with the connecting node N1 through an internal wiring 12 in the circuit forming region, as shown in FIG. 1. The peripheral wiring 4-X and the internal wiring 12 are formed as a contiguous metal wiring by a semiconductor manufacturing process. The peripheral wiring 4-X shown in FIGS. 3-5 includes the internal wiring 12. A resistance of the peripheral wiring 4-X including the internal wiring 12 is set to be small enough to be neglected compared with a resistance R1 of the first resistor R1 and a resistance R2 of the second resistor R2.

A reference voltage Vref is outputted from an output terminal of the reference voltage source VS. One end of the third resistor R3 (detection resistor) is connected with the output terminal of the reference voltage source VS. A source of the P-channel type MOS transistor M1 is connected with the power supply wiring 3 while its drain is connected with the other end of the third resistor R3. A voltage at the second end of the peripheral wiring 4-X, that is, the connecting node N1 between the first resistor R1 and the second resistor R2 is applied to a gate of the P-channel type MOS transistor M1. A resistor R4 for current limiting may be connected between the drain of the P-channel type MOS transistor M1 and the third resistor R3.

While whether the peripheral wiring 4-X is broken or not can be detected based on a voltage at a connecting node N2 between the drain of the P-channel type MOS transistor M1 and the resistor R3, the amplifier circuit Amp1 is used to output the voltage with a low impedance.

The amplifier circuit Amp1 includes an operational amplifier OP, a fifth resistor R5 (feedback resistor) and a photo diode PDx. The voltage at the connecting node N2 between the drain of the P-channel type MOS transistor M1 and the third resistor R3 is applied to a non-inverting input terminal (+) of the operational amplifier OP. A cathode of the photo diode PDx is connected with an inverting input terminal (−) of the operational amplifier OP while its anode is grounded.

As a result, the photo diode PDx is reverse-biased. The fifth resistor R5 is connected between an output terminal and the inverting input terminal (−) of the operational amplifier OP. There are disposed four photo diodes PDx (x=1, 2, 3 or 4) in a matrix form, each of which is rectangle-shaped as shown in the plan view of FIG. 1 and corresponds to each of the first through fourth detection circuits 10-1-10-4. The photo diode PDx is formed by stacking a P-type layer and an N-type layer in the top surface of the semiconductor substrate 1 in the circuit forming region.

The semiconductor integrated circuit 100 has the function to detect electrically the laser beam from the semiconductor laser in the optical disk unit, as described above. The reference voltage source VS and the amplifier circuit Amp1 form a laser beam detection circuit that is intrinsically provided to the semiconductor integrated circuit 100.

First, the operation of the detection circuit 10-X in the laser beam detection state is explained referring to FIG. 3. It is assumed that the peripheral wiring 4-X is not broken in this case. The resistance of the peripheral wiring 4-X including the internal wiring 12 is small enough to be neglected compared with the resistance R1 of the first resistor R1 and the resistance R2 of the second resistor R2.

Therefore, the voltage at the second end of the peripheral wiring 4-X, that is, the connecting node N1 between the first resistor R1 and the second resistor R2 is approximately equal to the power supply voltage Vcc, and the voltage applied to the gate of the P-channel type MOS transistor M1 is also approximately equal to the power supply voltage Vcc. Since a voltage between the gate and the source of the P-channel type MOS transistor M1 is approximately 0 V because a voltage at the source is equal to the power supply voltage Vcc, the P-channel type MOS transistor M1 is turned off. As a result, the voltage at the connecting node N2 becomes Vref, and the reference voltage Vref is applied to the non-inverting input terminal (+) of the operational amplifier OP.

When the reverse-biased photo diode PDx is irradiated with the laser beam in this state, a reverse diode current Ipx corresponding to strength of the laser beam and an area irradiated with the laser beam flows through the photo diode PDx. The diode current Ipx flows from the output terminal of the operational amplifier OP to the photo diode PDx through the fifth resistor R5.

An output voltage Amp_outx from the operational amplifier OP when irradiated with the laser beam is represented by following Equation (1).

$$Amp\_outx = Vref + Ipx \times R5 \quad (1)$$

here, R5 denotes a resistance of the fifth resistor R5.

When not irradiated with the laser beam, Amp_outx=Vref, because Ipx=0.

Thus, a spot location and the strength of the laser beam can be detected based on the output voltages Amp_out1-Amp_out4 of the first through fourth detection circuits 10-1-10-4.

For example, when a center of the laser beam spot (a circle depicted by a dashed line) coincides with a center O of the four photo diodes PD1-PD4 arrayed in the matrix form as shown in FIG. 1, the four output signals Amp_out1-Amp_out 4 are equal to each other.

When the laser beam spot is displaced from the center O of the four photo diodes PD1-PD4 arrayed in the matrix form, there are caused differences among the four output signals Amp_out1-Amp_out4, and the displacement of the laser beam spot can be detected in accordance with the differences.

Next, the operation of the detection circuit 10-X in the normal state (without breaking of the peripheral wiring 4-X) is explained referring to FIG. 4. In this case also as in the laser beam detection state shown in FIG. 3, the P-channel type MOS transistor M1 is turned off because the voltage applied to the gate of the P-channel type MOS transistor M1 is approximately equal to the power supply voltage Vcc. The photo diode PDx is not irradiated with the laser beam. As a result, the voltage at the connecting node N2 becomes Vref, and the output voltage Amp_outx from the detection circuit 10-X after going through the operational amplifier OP becomes Vref.

Next, the operation of the detection circuit 10-X in the abnormal state (with breaking of the peripheral wiring 4-X) is explained referring to FIG. 5. Since the peripheral wiring 4-X is broken in this case, the voltage at the connecting node N1 between the first resistor R1 and the second resistor R2 is determined as a divided voltage by the first resistor R1 and the second resistor R2.

That is, the voltage V(N1) at the connecting node N1 is represented by Equation (2).

$$V(N1) = Vcc \cdot R2/(R1+R2) \quad (2)$$

here, R1 denotes the resistance of the first resistor R1 and R2 denotes the resistance of the second resistor R2.

Denoting a threshold voltage of the P-channel type MOS transistor M1 as Vtp, R1, R2 and Vtp are set to satisfy following Inequality (3).

$$Vcc - V(N1) > Vtp \quad (3)$$

When Inequality (3) is satisfied, the P-channel type MOS transistor M1 is turned on. Then, a current Id flows from the P-channel type MOS transistor M1 to the reference voltage source VS through the fourth resistor R4 and the third resistor R3. Above explanation assumes that Vcc>Vref. In the case where Vcc<Vref on the other hand, the current Id flows in the opposite direction.

The voltage V(N2) at the connecting node N2 is represented by following Equation (4).

$$V(N2) = Vref + Id \times R3 \quad (4)$$

It is assumed that the photo diode PDx is not irradiated with the laser beam. Therefore, the output voltage Amp_outx after going through the operational amplifier OP becomes the same as V(N2), and is represented by Equation (5).

$$\text{Amp\_out}x = Vref + Id \times R3 \quad (5)$$

As described above, the output voltage Amp_outx becomes Vref in the case where the peripheral wiring 4-X is not broken, while the output voltage Amp_outx becomes Vref+Id×R3 in the case where the peripheral wiring 4-X is broken. Although in reality there appears an error of several tens of millivolts when the output voltage Amp_outx becomes Vref, the two cases can be distinguished from each other by setting Id×R3 larger enough than the error from Vref. For example, Id×R3 is set to 1 V when Vref is 2.2 V. As a result, whether the peripheral wiring 4-X is broken can be detected based on the output voltage Amp_outx from the detection circuit 10-X.

Figure 6:
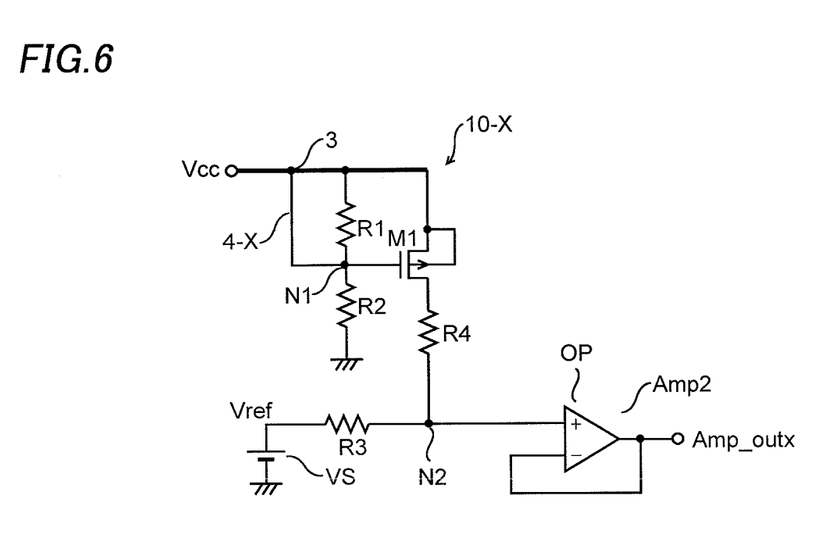
FIG. 6 shows a second circuit of each of the first through fourth detection circuits.

When the semiconductor integrated circuit 100 is not provided with the function to detect the laser beam, the operational amplifier circuit Amp1 described above may be replaced with an amplifier circuit Amp2 that is composed of the operational amplifier OP only, as shown in FIG. 6. That is, the voltage at the connecting node N2 is applied to the non-inverting input terminal (+) of the operational amplifier OP and the output voltage from the operational amplifier OP is fed back to the inverting input terminal (−) of the operational amplifier OP. In this case, the operational amplifier OP works as an output buffer.

Figure 9:
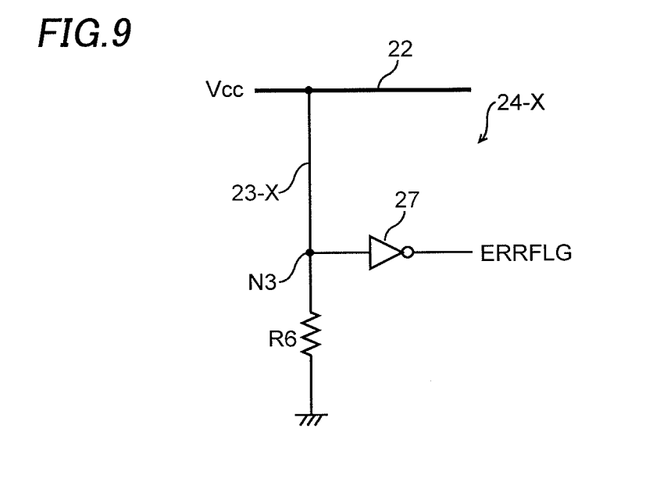
FIG. 9 shows a third circuit of each of the first through fourth detection circuits.
Figure 10:
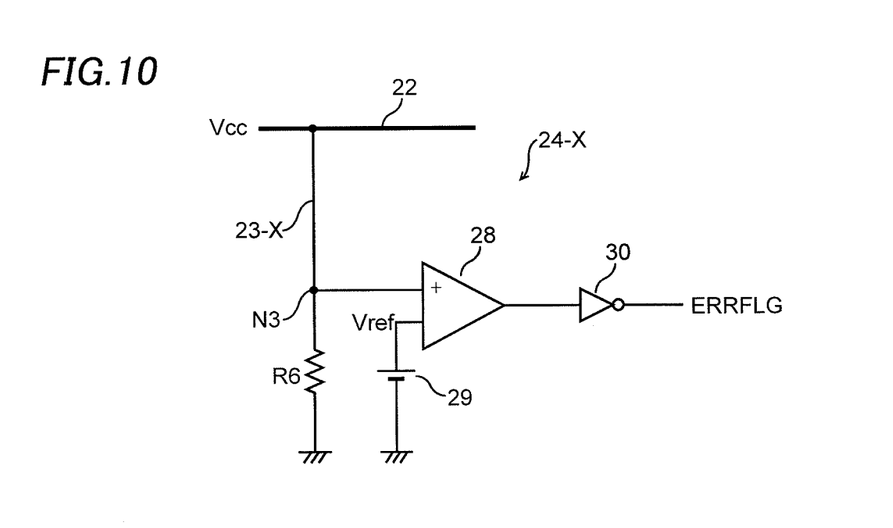
FIG. 10 shows a fourth circuit of each of the first through fourth detection circuits.

Each of the first through fourth detection circuits 10-1-10-4 may be formed of a circuit shown in FIG. 9 or FIG. 10 that is to be described.

Second Embodiment

Figure 7:
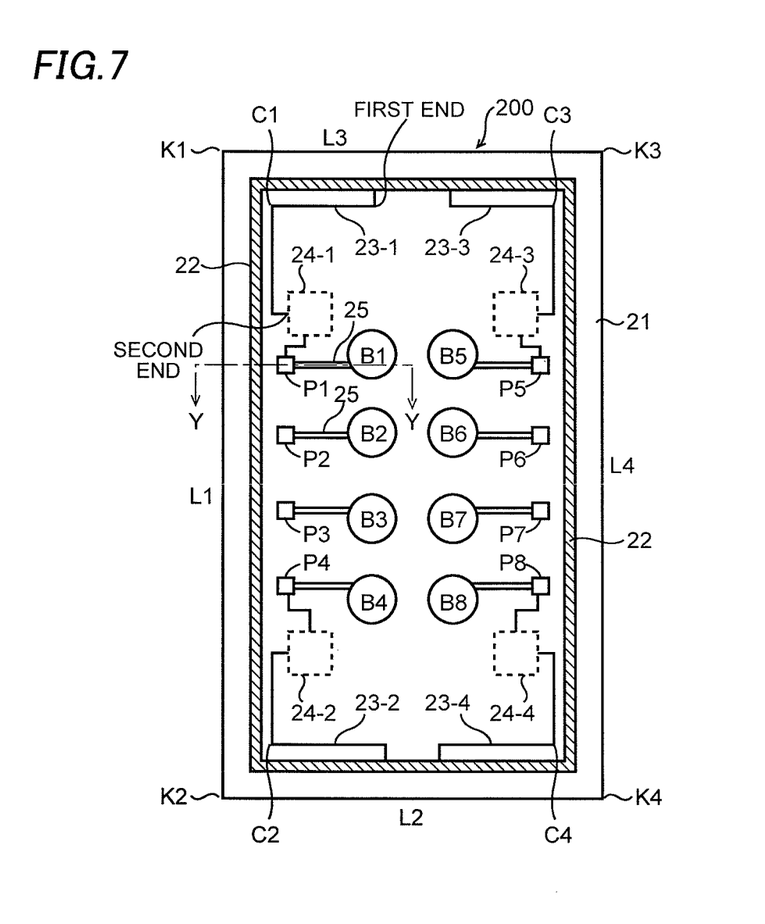
FIG. 7 is a plan view showing a semiconductor integrated circuit according to a second embodiment of this invention.
Figure 8:
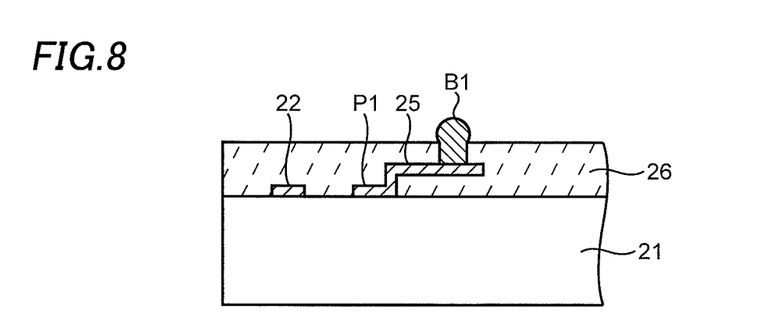
FIG. 8 is a cross-sectional view showing a section Y-Y in FIG. 7.

FIG. 7 is a plan view of a semiconductor integrated circuit 200 according to a second embodiment of this invention. FIG. 8 is a cross-sectional view of a section Y-Y shown in FIG. 7. The semiconductor integrated circuit 200 is packaged using the WLP technology.

A semiconductor substrate 21 is rectangle-shaped as shown in the plan view of FIG. 7, and has four edges L1-L4 and four corners K1-K4 each corresponding to an intersection of a neighboring pair of the edges. A ring-shaped power supply wiring 22 is disposed along an entire periphery of a top surface of the semiconductor substrate 21.

A region of the semiconductor substrate 21 surrounded by the power supply wiring 22 makes a circuit forming region. Pads P1-P8 are disposed on a periphery of the circuit forming region. Bump electrodes (protruding electrodes) B1-B8 each connected with corresponding each of the pads P1-P8 through a wiring layer 25 are disposed. The power supply wiring 22 is provided with the power supply voltage Vcc from a power supply pad P6 through a wiring (not shown).

As in the first embodiment, each of L-shaped first through fourth peripheral wirings 23-1-23-4 having a first end and a second end is disposed correspondingly to each of the four corners K1-K4 on the periphery of the semiconductor substrate 21.

That is, each of the first through fourth peripheral wirings 23-1-23-4 extends from each of locations C1-C4 in the circuit forming region corresponding to each of the four corners K1-K4 halfway along a neighboring pair of the edges. The first end of each of the first through fourth peripheral wirings 23-1-23-4 is connected with the power supply wiring 22. The second ends of the first through fourth peripheral wirings 23-1-23-4 are separated from each other so as not to make a short-circuit. The first through fourth peripheral wirings 23-1-23-4 may be formed on the semiconductor substrate 21 outside the power supply wiring 22.

It is preferable that a width of the first through fourth peripheral wirings 23-1-23-4 is determined in accordance with a minimum design rule of the semiconductor integrated circuit 200, which is 0.6 µm, for example, that is substantially smaller than the width of the power supply wiring 22.

Each of first through fourth detection circuits 24-1-24-4 is disposed in the circuit forming region surrounded by the power supply wiring 22, detects the breaking of corresponding each of the first through fourth peripheral wirings 23-1-23-4 in response to a voltage at the second end of corresponding each of the first through fourth peripheral wirings 23-1-23-4, and outputs corresponding each of first through fourth detection signals Amp_out1-Amp_out4 to corresponding each of output pads P1, P4, P5 and P8.

As a result, whether each of the first through fourth peripheral wirings 23-1-23-4 is broken or not can be detected based on corresponding each of the first through fourth detection signals Amp_out1-Amp_out4. The first through fourth detection circuits 24-1-24-4 have structures identical to the first through fourth detection circuits 10-1-10-4 in the first embodiment.

FIG. 8 is a cross-sectional view of a region around the output pad P1. The top surface of the semiconductor substrate 21 on which the power supply wiring 22, the output pad P1 and the wiring layer 25 are formed is covered by a resin layer 26. The resin layer 26 on the wiring layer 25 has a circle-shaped opening through which a bump electrode B1 is formed on the wiring layer 25. Regions around the other pads P2-P8 are formed similarly.

The semiconductor integrated circuit 200 formed by the WLP technology as described above is shipped to the customer. The customer manufactures various kinds of products by mounting various kinds of electronic parts including the semiconductor integrated circuit 200 onto a circuit board using electronic parts mounting apparatus such as a chip-mounter.

At that time, the semiconductor integrated circuit 200 is aligned to the circuit board so that the bump electrodes B1-B8 on the back surface of the semiconductor integrated circuit 200 are electrically connected to printed wirings or the like on the circuit board. In some cases, the defect such as chipping of the semiconductor substrate 21 of the semiconductor integrated circuit 200 is caused by the mechanical damage or the stress on that occasion. With the semiconductor integrated circuit 200 according to the embodiment, it is made possible to electrically identify which of the first through fourth peripheral wirings 23-1-23-4 corresponds to the location where the damage is caused.

Each of the first through fourth detection circuits 24-1-24-4 may be formed of a circuit shown in FIG. 9 or FIG. 10. Explanation is given assuming that the detection circuit 24-X shown in FIG. 9 or FIG. 10 makes one of the first through fourth detection circuits 24-1-24-4 and the peripheral wiring 23-X shown in the same figure makes corresponding one of the first through fourth peripheral wirings 23-1-23-4.

The detection circuit 24-X shown in FIG. 9 includes a sixth resistor R6 (detection resistor) and an inverter 27. A first end of the peripheral wiring 23-X is connected with the power supply wiring 22. A second end of the peripheral wiring 23-X is connected with one end of the sixth resistor R6. A connecting node between the peripheral wiring 23-X and the resistor R6 is denoted as N3. Another end of the sixth resistor R6 is grounded. A voltage at the connecting node N3 is applied to an input terminal of the inverter 27.

In this case, the second end of the peripheral wiring 23-X is connected with the connecting node N3 through an internal wiring in the circuit forming region, as shown in FIG. 7. The peripheral wiring 23-X and the internal wiring are formed as a contiguous metal wiring by the semiconductor manufacturing process. The peripheral wiring 23-X shown in FIG. 9 includes the internal wiring. A resistance of the peripheral wiring 23-X including the internal wiring is set to be small enough to be neglected compared with a resistance of the sixth resistor R6.

When the peripheral wiring 23-X is not broken, the voltage at the connecting node N3 is approximately equal to the power supply voltage Vcc. When the peripheral wiring 23-X is broken, the voltage at the connecting node N3 is equal to the ground voltage (0 V). When a threshold voltage of the inverter 27 is set to a voltage between the power supply voltage Vcc and the ground voltage (0 V), preferably to ½Vcc, an output voltage ERRFLG from the inverter 27 becomes an L level in the case where the peripheral wiring 23-X is not broken, and the output voltage ERRFLG from the inverter 27 becomes an H level when the peripheral wiring 23-X is broken. Thus, whether the peripheral wiring 23-X is broken or not can be detected.

The detection circuit 24-X shown in FIG. 10 includes a sixth resistor R6, a comparator 28, a reference voltage source 29 and an inverter 30. A voltage at a connecting node N3 between the peripheral wiring 23-X and the sixth resistor R6 is applied to a first input terminal (+) of the comparator 28. A reference voltage Vref from the reference voltage source 29 is applied to a second input terminal (−) of the comparator 28. An output from the comparator 28 is applied to an input terminal of the inverter 30.

When the reference voltage Vref is set to a voltage between the power supply voltage Vcc and the ground voltage (0 V), preferably to ½Vcc, the output from the comparator 28 becomes the H level and an output signals ERRFLG from the inverter 30 becomes the L level because the voltage at the connecting node N3 is approximately equal to the power supply voltage Vcc in the case where the peripheral wiring 23-X is not broken. On the other hand, the output from the comparator 28 becomes the L level and the output signal ERRFLG from the inverter 30 becomes the H level because the voltage at the connecting node N3 is at the ground voltage (0 V) when the peripheral wiring 23-X is broken. Thus, whether the peripheral wiring 23-X is broken or not can be detected.

Since the defect such as the chipping is prone to be caused in the periphery of the LSI die in the package using the CSP or WLP technology, this invention is particularly effective for detecting the defects in these packages as described above. However, this invention may be also applied to a semiconductor die in general because a similar defect is caused in the general semiconductor die before resin molding in some cases.

With the semiconductor integrated circuit according to the embodiment of this invention, it is made possible to electrically detect whether there is the defect such as chipping of the LSI die or separation of the resin layer for protection and in which location corresponding to each of the first through fourth peripheral wirings the defect is caused. As a result, controlling so that the LSI die with the defect is not shipped is made possible as well as contributing to analyzing the failure in the LSI die and improving the manufacturing process.

What is claimed is:

1. A semiconductor integrated circuit comprising:
a semiconductor substrate comprising four edges and four corners, each of the four corners corresponding to an intersection of a neighboring pair of the edges;
four L-shaped peripheral wirings, each of the four L-shaped peripheral wirings having a first end and a second end and disposed on a periphery of the semiconductor substrate around a corresponding one of the four corners;
a power supply wiring that is of a closed-loop shape and disposed on a periphery of the semiconductor substrate, the power supply wiring being connected with the first end of each of the four peripheral wirings and being provided with a power supply voltage;
four detection circuits disposed on the semiconductor substrate so as to be surrounded by the power supply wiring, each of the four detection circuits detecting breaking of a corresponding one of the four peripheral wirings in response to a voltage at the second end of the corresponding one of the four peripheral wirings and outputting a detection signal; and
four output pads disposed on the semiconductor substrate or adjacent the semiconductor substrate, the detection signal of each of the four detection circuits being outputted through a corresponding one of the four output pads.

2. The semiconductor integrated circuit of claim 1, wherein each of the four detection circuits comprises a reference voltage source outputting a reference voltage from its output terminal, a detection resistor comprising one end connected with the output terminal of the reference voltage source, and a switching device connected between the power supply wiring and another end of the detection resistor and turning on and off in response to a voltage at the second end of corresponding each of the first through fourth peripheral wirings, so that the breaking of a corresponding one of the four peripheral wirings is detected in accordance with a voltage at a connecting node between the switching device and the detection resistor.

3. The semiconductor integrated circuit of claim 2, wherein the switching device comprises an MOS transistor, each of the four detection circuits comprises first and second resistors connected in series between the power supply wiring and a ground, the second end of a corresponding one of the four peripheral wirings is connected with a connecting node between the first and second resistors, and the voltage at the second end of each of the four peripheral wirings is applied to a gate of the MOS transistor in a corresponding one of the four detection circuits.

4. The semiconductor integrated circuit of claim 2, wherein each of the four detection circuits comprises an operational amplifier comprising a first input terminal and a second input terminal, the voltage at the connecting node between the switching device and the detection resistor being applied to the first input terminal of the operational amplifier.

5. The semiconductor integrated circuit of claim 4, wherein each of the four detection circuits comprises a feedback resistor and a photo diode receiving a laser beam and converting the laser beam into a current, the feedback resistor being connected between an output terminal of the operational amplifier and the photo diode, the second input terminal of the operational amplifier being connected with a cathode of the photo diode.

6. The semiconductor integrated circuit of claim 1, wherein each of the four detection circuits comprises a detection resistor and an inverter, the detection resistor being connected between the second end of a corresponding one of the four peripheral wirings and a ground, a voltage at a connecting node between a corresponding one of the four peripheral wirings and the detection resistor being applied to the inverter.

7. The semiconductor integrated circuit of claim 1, wherein each of the four detection circuits comprises detection resistor, a comparator having a first and second input terminals and a reference voltage source outputting a reference voltage, the detection resistor being connected between the second end of a corresponding one of the four peripheral wirings and a ground, a voltage at a connecting node between a corresponding one of the four peripheral wirings and the detection resistor being applied to the first input terminal of the comparator, the reference voltage being applied to the second input terminal of the comparator.

8. The semiconductor integrated circuit of claim 1, wherein the four detection circuits are disposed on a front surface of the semiconductor substrate, and the semiconductor circuit further comprises four protruding electrodes disposed on a back surface of the semiconductor substrate and four wiring layers formed over the back surface and a side surface of the semiconductor substrate, each of the four wiring layers being connected between a corresponding one of the four protruding electrodes and a corresponding one of the four output pads.

9. The semiconductor integrated circuit of claim 1, wherein the four detection circuits are disposed on a front surface of the semiconductor substrate, and the semiconductor circuit further comprises four protruding electrodes disposed on the front surface of the semiconductor substrate and four wiring layers formed over the front surface of the semiconductor substrate and connected between a corresponding one of the four protruding electrodes and a corresponding one of the four output pads.

* * * * *